(12) United States Patent
Bian et al.

(10) Patent No.: US 12,635,266 B2
(45) Date of Patent: May 19, 2026

(54) SINGLE-PHOTON AVALANCHE DIODE INTEGRATED WITH QUENCHING RESISTOR AND MANUFACTURING METHOD THEREOF

(71) Applicant: CSMC TECHNOLOGIES FAB2 CO., LTD., Wuxi (CN)

(72) Inventors: Zheng Bian, Wuxi (CN); Kui Xiao, Wuxi (CN); Aifeng Zhao, Wuxi (CN); Jinjie Hu, Wuxi (CN); Tao Yang, Wuxi (CN)

(73) Assignee: CSMC TECHNOLOGIES FAB2 CO., LTD., Wuxi (CN)

( * ) Notice: Subject to any disclaimer, the term of this patent is extended or adjusted under 35 U.S.C. 154(b) by 396 days.

(21) Appl. No.: 18/578,226

(22) PCT Filed: Dec. 13, 2022

(86) PCT No.: PCT/CN2022/138575
§ 371 (c)(1),
(2) Date: Jan. 10, 2024

(87) PCT Pub. No.: WO2023/116501
PCT Pub. Date: Jun. 29, 2023

(65) Prior Publication Data
US 2024/0322061 A1     Sep. 26, 2024

(30) Foreign Application Priority Data

Dec. 24, 2021     (CN) ......................... 202111599112.X

(51) Int. Cl.
H10F 30/225     (2025.01)
H10D 1/47     (2025.01)
(Continued)

(52) U.S. Cl.
CPC ............. H10F 30/225 (2025.01); H10D 1/47 (2025.01); H10F 39/103 (2025.01); H10F 71/121 (2025.01); H10F 77/334 (2025.01)

(58) Field of Classification Search
CPC ........... H10D 1/47; H10D 8/01; H10D 8/021; H10D 8/024; H10F 39/103; H10F 71/121;
(Continued)

(56) References Cited

U.S. PATENT DOCUMENTS

2011/0095388 A1     4/2011   Richter et al.
2012/0153423 A1     6/2012   Lee
(Continued)

FOREIGN PATENT DOCUMENTS

CN     106298816 A     1/2017
CN     113299786 A     8/2021
(Continued)

OTHER PUBLICATIONS

Japanese Patent Office , Office Action Issued in Application No. 2024-500165, Jan. 10, 2025, 6 pages. (Submitted with Machine Translation).

(Continued)

*Primary Examiner* — Sonya McCall-Shepard
(74) *Attorney, Agent, or Firm* — Christopher R. Carroll; Carroll, Hoette, & Butscher, LLC

(57)     ABSTRACT

The present disclosure relates to a single-photon avalanche diode integrated with a quenching resistor and a manufacturing method thereof. The method includes: obtaining a wafer; patterning and etching a front surface of the base to form a quenching resistor trench and an isolation trench, (Continued)

wherein a width of the isolation trench is greater than a width of the quenching resistor trench; forming an insulation layer on an inner surface of the quenching resistor trench; depositing polycrystalline silicon on the front surface of the base, where the polycrystalline silicon is filled into the quenching resistor trench and seals the quenching resistor trench while the polycrystalline silicon is filled into the isolation trench and does not seal the isolation trench; performing oxidation treatment on the polycrystalline silicon in the isolation trench; filling a light-shielding conductive material into the isolation trench.

15 Claims, 8 Drawing Sheets

(51) Int. Cl.

| | | |
|---|---|---|
| *H10F 39/10* | (2025.01) | |
| *H10F 71/00* | (2025.01) | |
| *H10F 77/00* | (2025.01) | |
| *H10F 77/14* | (2025.01) | |
| *H10F 77/30* | (2025.01) | |

(58) Field of Classification Search
CPC ........ H10F 77/334; H10F 71/00; H10F 77/14; H10F 30/225; H10F 77/959; H10F 30/20; H10F 30/21; H10F 30/22; H10F 30/2255; Y02P 70/50
See application file for complete search history.

(56) References Cited

U.S. PATENT DOCUMENTS

| | | | |
|---|---|---|---|
| 2014/0167200 A1 | 6/2014 | Sun et al. | |
| 2016/0163583 A1 | 6/2016 | Liu et al. | |
| 2017/0098730 A1 | 4/2017 | Mazzillo et al. | |
| 2018/0269236 A1 | 9/2018 | Sasaki | |
| 2019/0312070 A1* | 10/2019 | Piemonte | H10F 77/959 |

FOREIGN PATENT DOCUMENTS

| | | |
|---|---|---|
| CN | 113299787 A | 8/2021 |
| JP | H04256376 A | 9/1992 |
| JP | H07221341 A | 8/1995 |
| JP | 2014160042 A | 9/2014 |
| JP | 2021106196 A | 7/2021 |
| KR | 20120124559 A | 11/2012 |

OTHER PUBLICATIONS

ISA State Intellectual Property Office of the People's Republic of China, International Search Report Issued in Application No. PCT/CN2022/138575, Feb. 22, 2023, WIPO, 4 pages.
ISA State Intellectual Property Office of the People's Republic of China, Written Opinion of the International Searching Authority Issued in Application No. PCT/CN2022/138575, Feb. 22, 2023, WIPO, 5 pages.(Submitted with Machine/Partial Translation).
State Intellectual Property Office of the People's Republic of China, Office Action and Search Report Issued in Application No. 202111599112X, Jul. 1, 2025, 11 pages.(Submitted with Machine/Partial Translation).

* cited by examiner

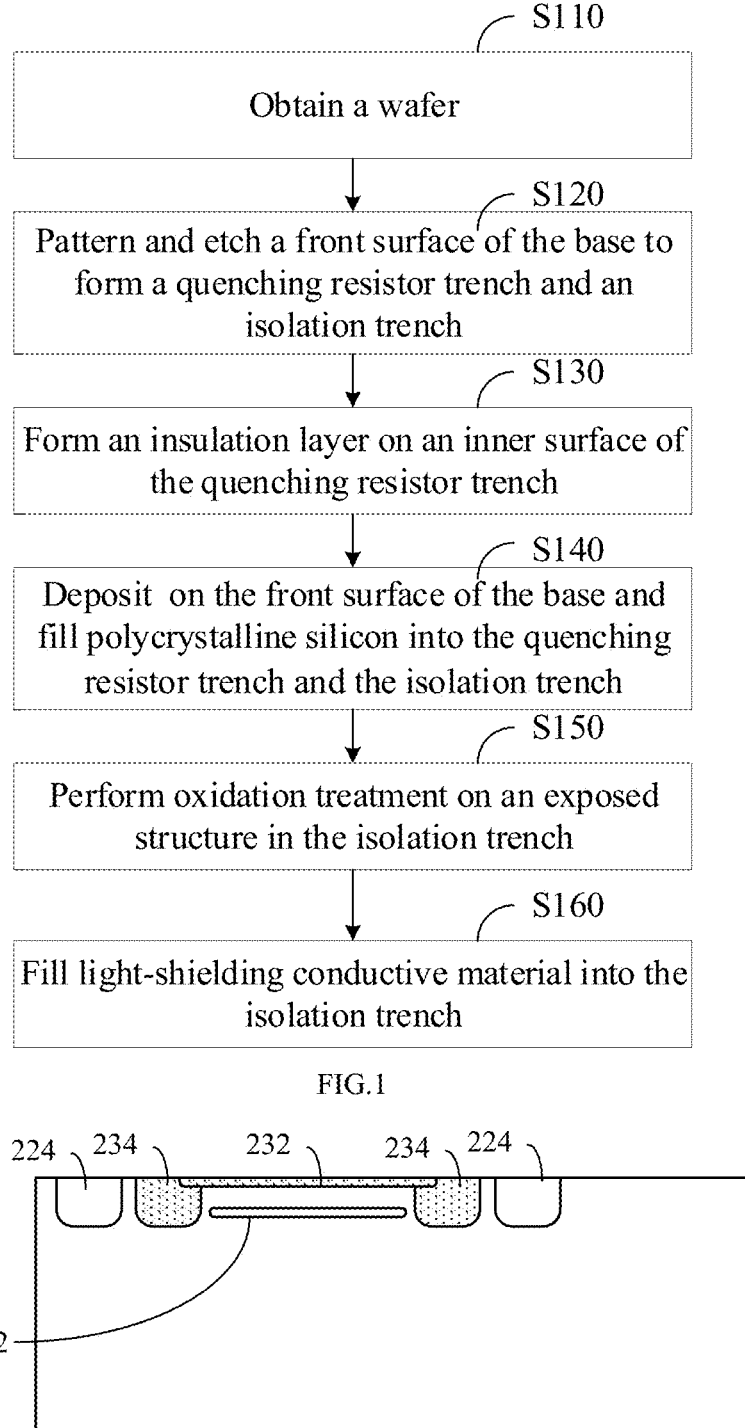

S110

Obtain a wafer

S120

Pattern and etch a front surface of the base to form a quenching resistor trench and an isolation trench

S130

Form an insulation layer on an inner surface of the quenching resistor trench

S140

Deposit on the front surface of the base and fill polycrystalline silicon into the quenching resistor trench and the isolation trench

S150

Perform oxidation treatment on an exposed structure in the isolation trench

S160

Fill light-shielding conductive material into the isolation trench

Polycrystalline
silicon
quenching
resistor

APD cell

DTI isolation tungsten plug

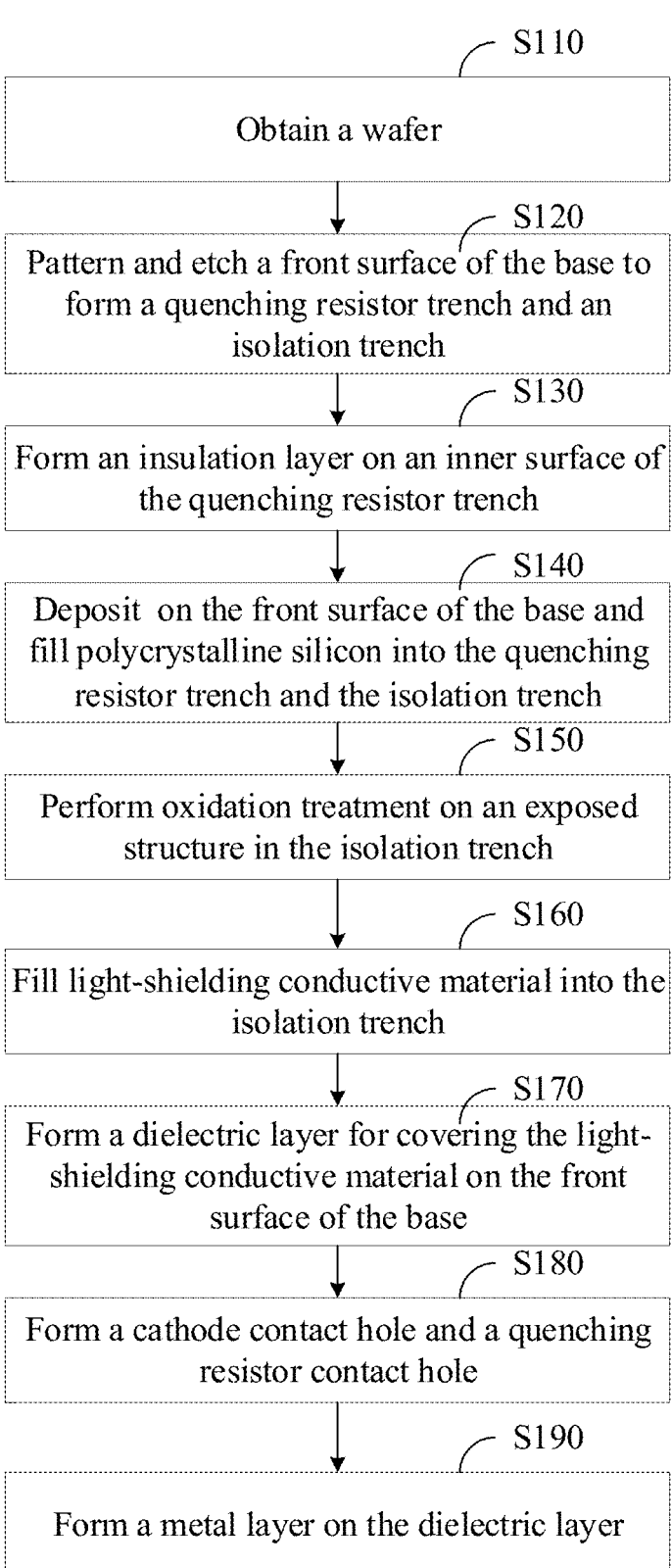

S110

Obtain a wafer

S120

Pattern and etch a front surface of the base to form a quenching resistor trench and an isolation trench

S130

Form an insulation layer on an inner surface of the quenching resistor trench

S140

Deposit on the front surface of the base and fill polycrystalline silicon into the quenching resistor trench and the isolation trench

S150

Perform oxidation treatment on an exposed structure in the isolation trench

S160

Fill light-shielding conductive material into the isolation trench

S170

Form a dielectric layer for covering the light-shielding conductive material on the front surface of the base

S180

Form a cathode contact hole and a quenching resistor contact hole

S190

Form a metal layer on the dielectric layer

FIG.5

SINGLE-PHOTON AVALANCHE DIODE INTEGRATED WITH QUENCHING RESISTOR AND MANUFACTURING METHOD THEREOF

CROSS REFERENCE TO RELATED APPLICATIONS

This application is a national stage of international PCT Application No. PCT/CN2022/138575 filed on Dec. 13, 2022, which claims priority to Chinese Patent Application No. 202111599112.X entitled "SINGLE-PHOTON AVA-LANCHE DIODE INTEGRATED WITH QUENCHING RESISTOR AND MANUFACTURING METHOD THEREOF" filed to Chinese Patent Office on Dec. 24, 2021, the entire contents of which are incorporated herein by reference.

TECHNICAL FIELD

The present disclosure relates to the field of semiconductor manufacturing and in particular to a single-photon ava-lanche diode integrated with a quenching resistor as well as a method of manufacturing a single-photon avalanche diode integrated with a quenching resistor.

BACKGROUND

At present, the intelligentization for vehicles is an irre-sistible trend and more and more assisted drive and self-driving technologies are applied to new models of vehicles. A core hardware relating to this is Laser Radar (LiDAR) and a device forming a signal collection part of the LiDAR is a photoelectric discrete device, such as Avalanche Photon Diode (APD), Single Photon Avalanche Diode (SPAD). The SPAD technology relative to the APD technology is like a digital circuit relative to an analog circuit. Compared with the APD technology, the SPAD technology has the advan-tages of high gain, ease of integration, low power consump-tion, and low susceptibility to temperature and the like, thus having broader application prospect.

For the purpose of performing continuous detection and responding to a next photo signal in time, the SPAD is to be provided with a quenching circuit to quickly quench an avalanche upon occurrence of the avalanche such that the SPAD can be restored to a photon reception state. In many quenching modes, a passive quenching circuit is the simplest one with its principle shown in FIG. 4, where a cathode of the SPAD is connected with a quenching resistor RL.

Since the exemplary SPAD process requires isolation for an APD sub-cell, it is required to introduce a tungsten-plug deep trench isolation (DTI) process. But, due to formation of a quenching resistor, it is required to perform polycrystalline silicon deposition of the quenching resistor after the tung-sten-plug DTI metal process, which goes against the metal process control rule of conventional semiconductor facto-ries. In this case, its process is incompatible with the conventional semiconductor production lines.

SUMMARY

Based on this, it is necessary to provide a method of manufacturing a single-photon avalanche diode integrated with a quenching resistor, which is compatible with Comple-mentary Metal Oxide Semiconductor (CMOS) process.

The method of manufacturing a single-photon avalanche diode integrated with a quenching resistor includes: obtaining a wafer, where the wafer includes a base and an avalanche photon diode cell formed in the base; patterning and etching a first surface of the base to form a quenching resistor trench and an isolation trench, where a width of the isolation trench is greater than a width of the quenching resistor trench; forming an insulation layer on an inner surface of the quenching resistor trench; depositing polycrystalline silicon on the first surface of the base, where the polycrystalline silicon is filled into the quenching resis-tor trench and seals the quenching resistor trench while the polycrystalline silicon is filled into the isolation trench and does not seal the isolation trench; performing oxidation treatment on an exposed structure in the isolation trench; filling a light-shielding conductive material into the isolation trench; wherein the isolation trench is located outside both the avalanche photon diode cell and the quenching resistor trench to isolate the avalanche photon diode cell and a quenching resistor.

In the above method of manufacturing a single-photon avalanche diode integrated with a quenching resistor, a polycrystalline silicon quenching resistor is formed in the quenching resistor trench. Since the width of the isolation trench is greater than the width of the quenching resistor trench, when the quenching resistor trench is filled up with the polycrystalline silicon, the isolation trench still has a space to be filled with the light-shielding conductive mate-rial subsequently. The polycrystalline silicon in the isolation trench may be oxidized as an insulation layer during oxi-dation treatment on the isolation trench. Because the quenching resistor trench is filled up with the polycrystalline silicon, only the surface of the polycrystalline silicon in the quenching resistor trench is oxidized when oxidation is performed on the polycrystalline silicon in the isolation trench and thus the polycrystalline silicon in the quenching resistor trench can be retained as the polycrystalline silicon quenching resistor. In conclusion, the above method of manufacturing a single-photon avalanche diode integrated with a quenching resistor can achieve the process of firstly depositing the polycrystalline silicon quenching resistor and then depositing the light-shielding conductive material, which is compatible with the CMOS process.

In one embodiment, the avalanche photon diode cell includes an avalanche photon diode cathode region and the manufacturing method further includes: forming a dielectric layer for covering the light-shielding conductive material on the first surface of the base; forming a cathode contact hole and a quenching resistor contact hole; where a bottom of the cathode contact hole extends to the avalanche photon diode cathode region, a bottom of the quenching resistor contact hole extends to the polycrystalline silicon in the quenching resistor trench, and a first conductive material is filled into the cathode contact hole and the quenching resistor contact hole; forming a metal layer on the dielectric layer, where a partial structure of the metal layer is electrically connected to the first conductive material in the cathode contact hole and the quenching resistor contact hole; by removing the dielectric layer above a partial region of the avalanche photon diode cathode region, forming a light incidence window on the first surface of the base to allow external light to be incident on the avalanche photon diode cathode region through the light incidence window.

In one embodiment, the first conductive material is a metal tungsten.

In one embodiment, in the step of forming the cathode contact hole and the quenching resistor contact hole, the cathode contact hole includes a first contact hole located at one side of the light incidence window and a second contact hole located at the other side.

In one embodiment, the step of patterning and etching the first surface of the base to form the quenching resistor trench and the isolation trench includes: performing photo-etching with a first photo-etching plate to form a quenching resistor trench etching window and an isolation trench etching window in a photoresist on the first surface of the base, where a width of the isolation trench etching window is greater than a width of the quenching resistor trench etching window; etching the base by using the quenching resistor trench etching window and the isolation trench etching window to form the quenching resistor trench and the isolation trench; where a depth of the isolation trench is greater than a depth of the quenching resistor trench.

In one embodiment, a light transmittance of the light-shielding conductive material is lower than a light transmittance of silicon and silicon dioxide.

In one embodiment, the light-shielding conductive material includes a metal tungsten.

In one embodiment, in the step of obtaining the wafer, the base of the obtained wafer includes a substrate of a second conductive type and an epitaxial layer on the substrate, the epitaxial layer is of the second conductive type, and the avalanche photon diode cathode region is located in the epitaxial layer and is of a first conductive type; the first conductive type and the second conductive type are opposite conductive types.

In one embodiment, in the step of obtaining the wafer, the avalanche photon diode cell of the obtained wafer further includes: a second conductive-type well region, located at two sides of the avalanche photon diode cathode region; a second conductive-type buried layer, located in the epitaxial layer and below the avalanche photon diode cathode region; where a doping concentration of the epitaxial layer is less than a doping concentration of the substrate and the second conductive-type buried layer.

In one embodiment, in the step of obtaining the wafer, the avalanche photon diode cell of the obtained wafer further includes an annular doping region located in the epitaxial layer, the annular doping region is located at an inner side of the second conductive-type well region at two sides of the avalanche photon diode cathode region, and the annular doping region is of a first conductive type.

In one embodiment, before the step of patterning and etching the first surface of the base, the method further includes a step of forming a light-transmitting silicon nitride layer on the first surface of the base and a step of forming a hard mask on the light-transmitting silicon nitride layer; the step of patterning and etching the first surface of the base to form the quenching resistor trench and the isolation trench includes: performing photo-etching on the hard mask and etching the hard mask, the light-transmitting silicon nitride layer and the base to form the quenching resistor trench and the isolation trench.

In one embodiment, a material of the hard mask includes silicon oxide; after the step of forming the quenching resistor trench and the isolation trench, and before the step of forming the insulation layer on the inner surface of the quenching resistor trench, the method further includes: performing oxidation treatment on the inner surface of the quenching resistor trench and an inner surface of the isolation trench; removing an oxide layer on the inner surface of the quenching resistor trench and an oxide layer on the inner surface of the isolation trench by a wet method and at the same time, removing the hard mask.

In one embodiment, the first conductive type is N type and the second conductive type is P type.

In one embodiment, the step of forming the insulation layer on the inner surface of the quenching resistor trench includes: growing an oxide layer as an insulation layer by performing thermal oxidation on the inner surface of the quenching resistor trench and the inner surface of the isolation trench.

In one embodiment, before the step of oxidizing the polycrystalline silicon in the isolation trench, the method further includes a step of doping the polycrystalline silicon in the quenching resistor trench to adjust a resistivity.

In one embodiment, the polycrystalline silicon on the first surface of the base is oxidized while the step of oxidizing the polycrystalline silicon in the isolation trench is performed.

There is provided a single-photon avalanche diode integrated with a quenching resistor, which includes: a base; and an avalanche photon diode cell, formed in the base; where a quenching resistor trench and an isolation trench located outside both the avalanche photon diode cell and the quenching resistor trench are formed in the base, a width of the isolation trench is greater than a width of the quenching resistor trench, and an insulation layer is formed on an inner surface of the quenching resistor trench and an inner surface of the isolation trench; the single-photon avalanche diode integrated with a quenching resistor further includes a polycrystalline silicon quenching resistor inside the quenching resistor trench and a light-shielding conductive material inside the isolation trench; the isolation trench is used to isolate the avalanche photon diode cell and a quenching resistor.

In the above single-photon avalanche diode integrated with a quenching resistor, the polycrystalline silicon quenching resistor is formed in the quenching resistor trench and the width of the quenching resistor trench is less than the width of the isolation trench. Thus, (since the quenching resistor trench and the isolation trench share one photo-etching plate) the manufacturing of the quenching resistor does not require use of another photo-etching plate, reducing the production costs.

In one embodiment, the base includes a substrate of a second conductive type and an epitaxial layer of the second conductive type on the substrate, the avalanche photon diode cell includes an avalanche photon diode cathode region in the epitaxial layer, and the avalanche photon diode cathode region is of a first conductive type; the first conductive type and the second conductive type are opposite conductive types; the single-photon avalanche diode integrated with a quenching resistor further includes a dielectric layer, located on the epitaxial layer and covering the light-shielding conductive material; and a metal layer, located on the dielectric layer; where, a cathode contact hole is formed between the metal layer and the avalanche photon diode cathode region, a quenching resistor contact hole is formed between the metal layer and the polycrystalline silicon quenching resistor, a first conductive material is filled into the cathode contact hole and the quenching resistor contact hole, and a partial structure of the metal layer is electrically connected to the first conductive material in the cathode contact hole and the quenching resistor contact hole; a light incidence window is formed above the avalanche photon diode cathode region to allow external light to be incident onto the avalanche photon diode cathode region through the light incidence window.

In one embodiment, the cathode contact hole includes a first contact hole located at one side of the light incidence window and a second contact hole located at the other side.

In one embodiment, the avalanche photon diode cell further includes: a second conductive-type well region, located at two sides of the avalanche photon diode cathode region; a second conductive-type buried layer, located in the epitaxial layer and below the avalanche photon diode cathode region; wherein a doping concentration of the epitaxial layer is less than a doping concentration of the substrate and the second conductive-type buried layer.

In one embodiment, the avalanche photon diode cell further includes an annular doping region located in the epitaxial layer, the annular doping region is located at an inner side of the second conductive-type well region at two sides of the avalanche photon diode cathode region, and the annular doping region is of the first conductive type.

BRIEF DESCRIPTION OF DRAWINGS

In order to more clearly describe the technical solutions in the embodiments of the present disclosure or the conventional technologies, the drawings required for descriptions of the embodiments or the conventional technologies will be briefly introduced below.

Apparently, the drawings described hereunder are only some embodiments of the present disclosure, and those skilled in the arts can also obtain other drawings based on these drawings without making creative work.

FIG. 1 is flowchart illustrating a method of manufacturing a single-photon avalanche diode integrated with a quenching resistor according to an embodiment of the present disclosure.

FIG. 5 is a flowchart illustrating a method of manufacturing a single-photon avalanche diode integrated with a quenching resistor according to another embodiment of the present disclosure.

DETAILED DESCRIPTION

Figure 2B:
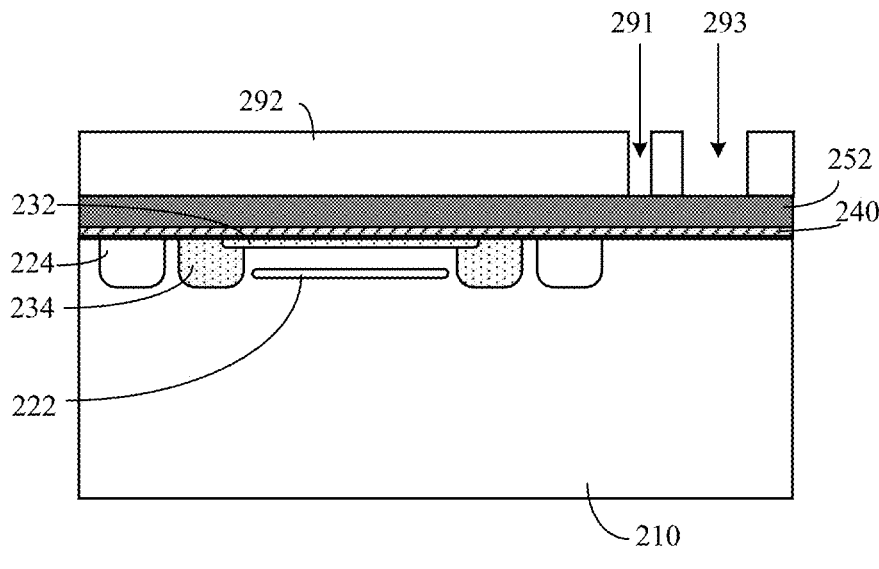
FIGS. 2a to 2n are sectional views illustrating a device structure in a process of manufacturing a single-photon avalanche diode integrated with a quenching resistor by using the method shown in FIG. 1 according to an embodiment of the present disclosure.

In order to help understand the present disclosure, the present disclosure will be more fully described below by referring to the drawings. The first-selected embodiments of the present disclosure are given in the accompanying drawings. But the present disclosure can be implemented in many different forms and thus not limited to the embodiments described herein. To the contrary, these embodiments are provided to make the contents of the present disclosure more thorough and comprehensive.

Unless otherwise defined, all technical and scientific terms used herein have the same meanings as those skilled in the arts generally understand. The terms used in the specification of the present disclosure are used only for the purpose of describing specific embodiments rather than for limiting the present disclosure. The term "and/or" used herein includes any and all combinations of one or more related listed items.

It should be understood that when an element or layer is referred to as being "on" "adjacent to", "connected to" or "coupled to" another element or layer, such element or layer can be directly on, or adjacent to, or connected to or coupled to another element or layer, or there is an intermediate element or layer therebetween. On the contrary, when an element is referred to as being "directly on" or "directly adjacent to", or "directly connected to" or "directly coupled to" another element or layer, there is no intermediate element or layer therebetween. It should be understood that although various elements, components, areas, layers and/or parts can be described with the terms first, second and third and the like, these elements, components, areas, layers and/or parts shall not be limited by these terms. These terms are used only to distinguish one element, component, area, layer and/or part from another element, component, area, layer and/or part. Therefore, without departing from the teaching of the present disclosure, the first element, component, area, layer or part discussed hereunder can be referred to as second element, component, area, layer or part.

The spatial relational terms such as "below", "under", "underneath", "on" and "above" and the like are used herein for ease of descriptions to describe a relationship between one element or feature and another element or feature in the drawings. It should be understood that in addition to the orientations shown in the drawings, the spatial relational terms are intended to further include different orientations of the devices in use or operation. For example, if a device in the drawings is turned over, and then described as "under another element", or "thereunder" or "hereunder", the element or feature will be oriented as being "on" another element or feature. As a result, the exemplary terms "under" and "below" may include up and down orientations. The device may be additionally oriented (rotated 90 degrees or another) and the spatial descriptive terms used herein are explained accordingly.

The terms are used herein to only describe specific embodiments rather than limit the present disclosure. In use, the terms "one", "an" and "the/said" in singular form are also intended to include plural form unless otherwise clearly indicated in the context. It also should be understood that, the terms "form" and/or "include" are used in the specification, presence of the features, integers, steps, operations, elements and/or components is determined but presence or addition of one or more other features, integers, steps, operations, elements, components and/or groups is not excluded. In use, the term "and/or" includes any or all combinations of related listed items.

The embodiments of the present disclosure are described by referring to the sectional views of the schematic diagrams of the ideal embodiments (and intermediate structures) of the present disclosure. Thus, the changes of the illustrated shapes resulting from, for example, manufacturing technology and/or tolerance can be anticipated. Therefore, the embodiments of the present disclosure shall not be limited to the specific shapes of the illustrated regions but include shape deviations resulting from, for example, manufacturing. For example, the implant region shown as rectangle usually has circular or bending features and/or implant concentration gradients at its edge, without binary change from the implant region to the non-implant region. Likewise, a burying region formed by implantation may result in some implantations in regions between the burying region and a surface passed during the implantation. Thus, the regions shown in the drawings are essentially exemplary and their shapes are not intended to display the actual shapes of the regions of the devices nor limit the scope of the present disclosure.

The terms of the semiconductor field used herein are technical terms commonly used by those skilled in the arts. For example, for P type and N type impurities, for the purpose of distinguishing the doping concentrations, P+ type simply represents a P type with a heavily-doped concentration, P type represents a P type with a moderately-doped concentration and P-type represents a P type with a lightly-doped concentration; N+ type represents a N type with a heavily-doped concentration, N type represents an N type with a moderately-doped concentration and N-type represents an N type with a lightly-doped concentration.

Since the exemplary SPAD process requires isolation for an APD sub-cell, it is required to introduce a tungsten-plug deep trench isolation (DTI) process. If a polycrystalline silicon quenching resistor is prepared firstly, the polycrystalline silicon will be filled into the DTI and thus tungsten cannot be filled in the DTI in a subsequent process. Therefore, in the exemplary SPAD process, a manufacturing process in which metal tungsten is before polycrystalline silicon is carried out. But, in the production lines of semiconductor fab in CMOS processes and the like, polycrystalline silicon deposition belongs to an early-stage manufacturing process while the metal processes such as tungsten plug belong to a late-stage manufacturing process. After the tungsten plug process is performed, it is difficult for the wafers to return to the early-stage manufacturing process of polycrystalline silicon. Therefore, the exemplary SPAD process goes against the control rule of the conventional CMOS process, that is, it is incompatible with the CMOS process.

Figure 3:
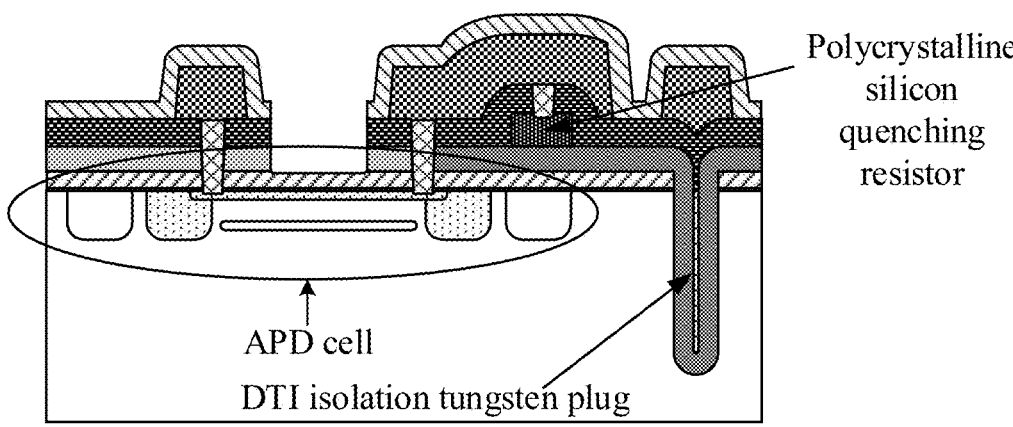
FIG. 3 is a structural schematic diagram illustrating a single-photon avalanche diode (SPAD) integrated with a quenching resistor according to an embodiment of the present disclosure.
Figure 4:
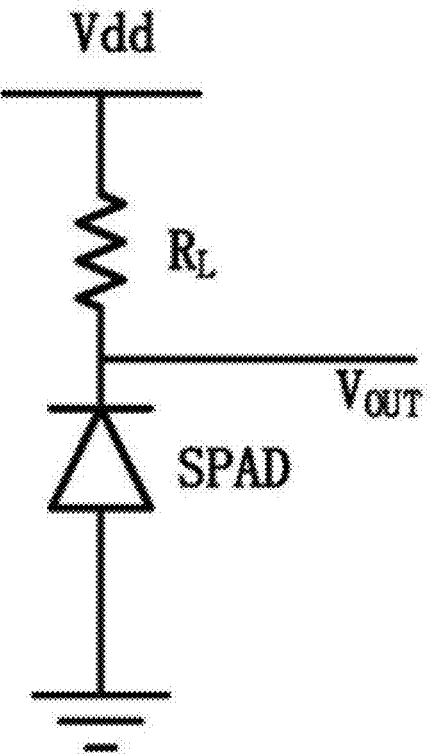
FIG. 4 is a circuit principle diagram of an SPAD and a quenching resistor according to an embodiment of the present disclosure.

FIG. 3 is a structural schematic diagram illustrating an exemplary SPAD device, where DTI isolation tungsten plug is used around the entire APD cell to achieve isolation from other cells. A polycrystalline silicon elongated resistor (quenching resistor) floating over a dielectric oxide layer is prepared at a cathode of the device. The quenching resistor is connected via a metal layer, whereas a cathode lead wire of the device is connected via the metal layer at the other end of the quenching resistor. In the device structure, after a DTI trench is formed, an oxide layer is prepared at an inner sidewall of the trench immediately. At the same time, an isolation medium is prepared on a surface where the quenching resistor is located. Then, it is required to complete the preparation of in-DTI tungsten plug. The reason is that: if the quenching resistor polycrystalline silicon is prepared firstly, the polycrystalline silicon will be filled in the DTI and thus tungsten cannot be subsequently filled therein. As a result, for the SPAD device, the manufacturing process in which metal tungsten is before polycrystalline silicon is carried out, leading to incompatibility with the CMOS process.

The present disclosure is mainly directed to the operation mode of the production lines of general semiconductor factories and optimizes the structure and the manufacturing method of the conventional SPAD device integrated with a quenching resistor so as to adapt to the production lines of the general semiconductor factories.

FIG. 1 is a flowchart illustrating a method of manufacturing a single-photon avalanche diode integrated with a quenching resistor according to an embodiment of the present disclosure. The method includes the following steps.

At step S110, a wafer is obtained.

The wafer includes a base 210 and an avalanche photon diode cell formed in the base 210. That is, the preparation of the basic structure of the APD is completed before step S120. In an embodiment shown in FIG. 2a, the avalanche photon diode cell includes a second conductive-type buried layer 222, a second conductive-type well region 224, an avalanche photon diode cathode region 232, and an annular doping region 234. In an embodiment of the present disclosure, the base 210 includes a substrate and an epitaxial layer located on the substrate. The substrate is a silicon substrate and the epitaxial layer is a silicon epitaxial layer. The second conductive-type buried layer 222, the second conductive-type well region 224, the avalanche photon diode cathode region 232 and the annular doping region 234 are disposed in the epitaxial layer. The second conductive-type well region 224 is located at two sides of the avalanche photon diode cathode region 232, the second conductive-type buried layer 222 is located below the avalanche photon diode cathode region 232, and the annular doping region 234 is located at an inner side of the second conductive-type well region 224 at two sides of the avalanche photon diode cathode region 232. The substrate and the epitaxial layer are of the second conductive type, and the avalanche photon diode cathode region 232 and the annular doping region 234 are of the first conductive type. In one embodiment of the present disclosure, the first conductive type is N type and the second conductive type is P type. In other embodiments of the present disclosure, the first conductive type may also be P type and the second conductive type may be N type.

At step S120, a front surface of the base is patterned and etched to form a quenching resistor trench and an isolation trench.

A width of the isolation trench 213 is greater than a width of the quenching resistor trench 211. In one embodiment of the present disclosure, before the step S120 is performed, the method further includes a step of forming a light-transmitting silicon nitride layer 240 on the front surface of the base 210 (the light-transmitting silicon nitride layer 240 is formed on the epitaxial layer) and a step of forming a hard mask 252 on the light-transmitting silicon nitride layer 240.

Figure 2C:
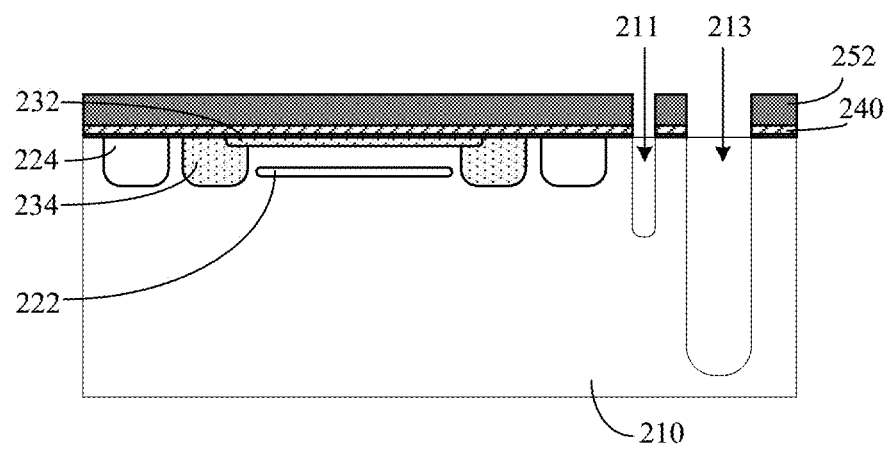

With reference to FIG. 2b and FIG. 2c, in one embodiment of the present disclosure, the hard mask 252 is photo-etched by using a first photo-etching plate, and a quenching resistor trench etching window 291 and an isolation trench etching window 293 are formed in a photoresist 292 on the hard mask 252, where a width of the isolation trench etching window 293 is greater than a width of the quenching resistor trench etching window 291. Next, the hard mask 252, the light-transmitting silicon nitride layer 240 and the base 210 are etched through the quenching resistor trench etching window 291 and the isolation trench etching window 293 to form the quenching resistor trench 211 and the isolation trench 213, namely, the quenching resistor trench 211 and the isolation trench 213 are formed in a same processing step. Since the width of the isolation trench etching window 293 is greater than the width of the quenching resistor trench etching window 291, due to loading effect of etching, an etching speed for the isolation trench 213 is greater than an etching speed for the quenching resistor trench 211. Therefore, a depth of the isolation trench 213 is greater than a depth of the quenching resistor trench 211. A resistance value of the quenching resistor may be adjusted by controlling the width and depth of the quenching resistor trench 211 but the depth of the isolation trench 213 should be guaranteed at the same time to achieve a desired isolation effect. In one embodiment of the present disclosure, the depth of the isolation trench 213 is no less than a thickness of the epitaxial layer, namely, the bottom of the isolation trench 213 extends to the substrate. The hard mask 252 is made of a material different from the substrate, the epitaxial layer and the light-transmitting silicon nitride layer 240. In one embodiment of the present disclosure, the material of the hard mask 252 is an oxide of silicon, for example, silicon dioxide. After the step S120 is completed, the photoresist 292 is removed.

At step S130, an insulation layer is formed on an inner surface of the quenching resistor trench.

Figure 2D:
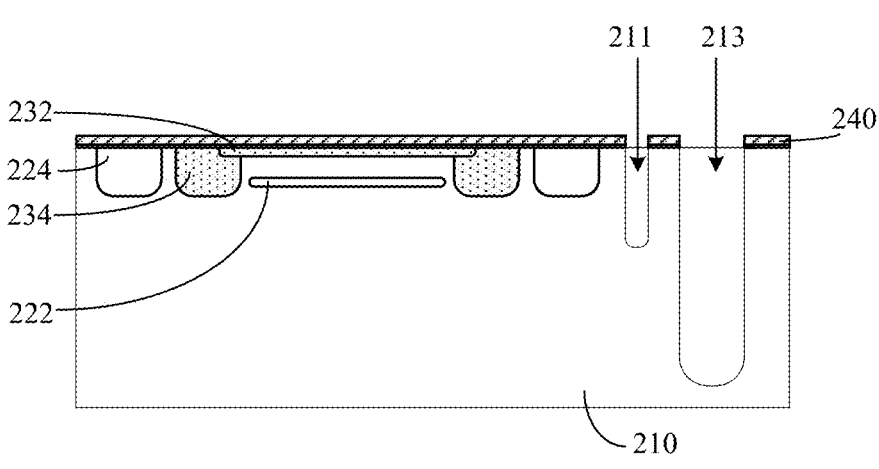
Figure 2E:
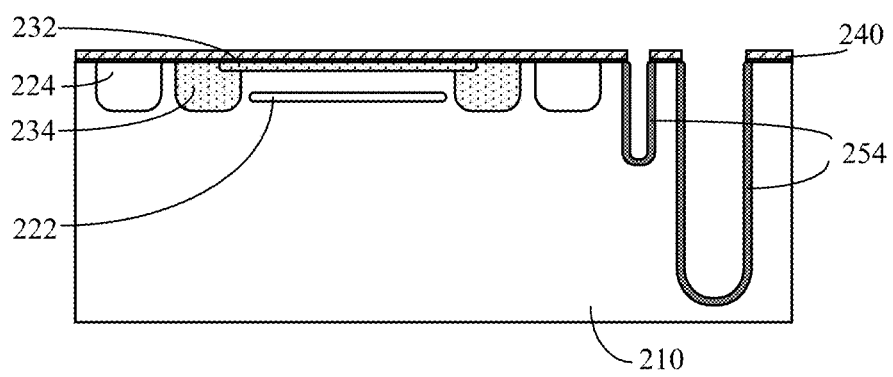

In one embodiment of the present disclosure, before the step S130 is performed, the method further includes a step of performing oxidation treatment on the inner surface of the quenching resistor trench 211 and an inner surface of the isolation trench 213. A sacrificial oxide layer is formed by the oxidation treatment. Afterwards, the sacrificial oxide layer is removed by a wet method and the hard mask 252 is removed at the same time to obtain the structure shown in FIG. 2*d*. Next, an oxide layer is grown as an insulation layer 254 by performing low temperature thermal oxidation on the inner surface of the quenching resistor trench 211 and the inner surface of the isolation trench 213, as shown in FIG. 2*e*.

At step S140, polycrystalline silicon is deposited on the front surface of the base and filled into the quenching resistor trench and the isolation trench.

Figure 2F:
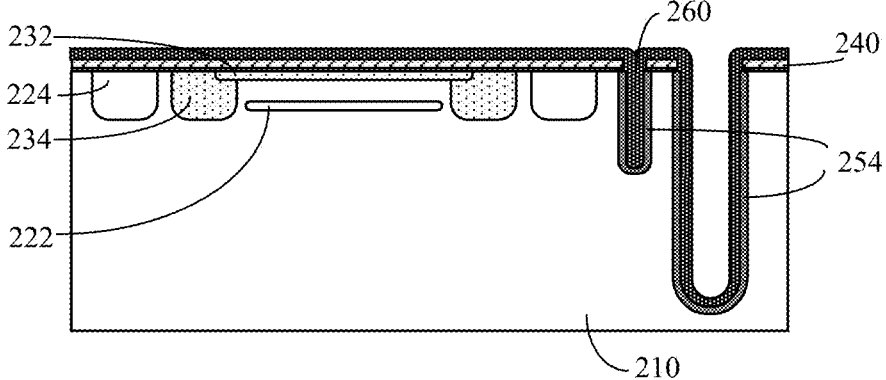

The polycrystalline silicon is filled into the quenching resistor trench 211 and seals the quenching resistor trench 211 while the polycrystalline silicon is filled into the isolation trench 213 but does not seal the isolation trench 213. Because a light-shielding conductive material is to be filled into the isolation trench 213 in a subsequent step, the width of the isolation trench 213 is significantly greater than the width of the quenching resistor trench 211 to ensure the isolation trench 213 is not sealed by the polycrystalline silicon while the quenching resistor trench 211 is sealed by the polycrystalline silicon (or the quenching resistor trench 211 is filled up). With reference to FIG. 2*f*, the polycrystalline silicon is deposited on the epitaxial layer and filled into the quenching resistor trench 211 (not shown in FIG. 2*f*) and the isolation trench 213 (not shown in FIG. 2*f*). In this case, the quenching resistor trench 211 is filled up whereas the polycrystalline silicon is formed on the inner surface of the isolation trench 213 without sealing the isolation trench 213 due to the greater width of the isolation trench 213. The polycrystalline silicon 260 in the quenching resistor trench 211 is subsequently taken as a polycrystalline silicon quenching resistor. Designing the depth of the isolation trench 213 as far greater than the depth of the quenching resistor trench 211 can shield the influence of the quenching resistor trench on an electric field in an avalanche region.

In one embodiment of the present disclosure, by doping the polycrystalline silicon 260, a resistivity of the polycrystalline silicon quenching resistor may be adjusted. The major manners for adjusting the resistivity of the polycrystalline silicon quenching resistor are adjusting the resistivity by ion implantation and performing layout designing on the width and the total length of the quenching resistor trench 211.

At step S150, oxidation treatment is performed on an exposed structure in the isolation trench.

Figure 2G:
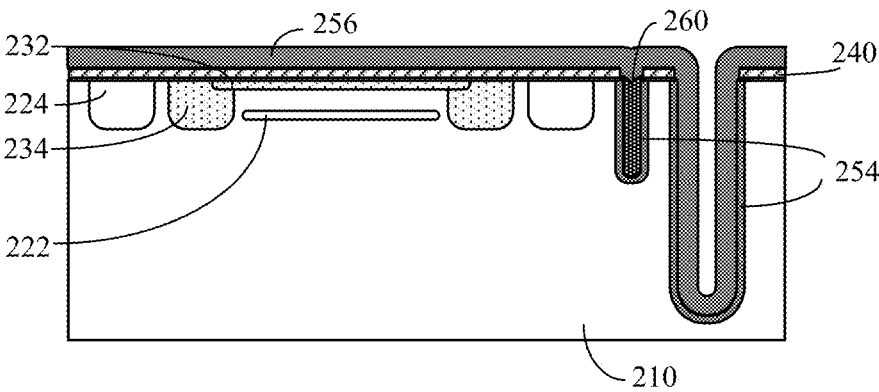

As shown in FIG. 2*g*, since the exposed structure of the isolation trench 213 is the polycrystalline silicon 260, the polycrystalline silicon 260 is oxidized. While the polycrystalline silicon in the isolation trench 213 (not shown in FIG. 2*g*) is oxidized, the polycrystalline silicon on the epitaxial layer (i.e. the polycrystalline silicon on the front surface of the base) is also oxidized, and thus an insulation layer 256 is formed. Because the quenching resistor trench 211 is filled up with the polycrystalline silicon, only the surface of the polycrystalline silicon in the quenching resistor trench 211 is oxidized and the remaining part is retained as the polycrystalline silicon quenching resistor. If the material of the substrate 210 is exposed on the inner surface of the isolation trench 213, the silicon on the substrate 210 is also oxidized into an insulation material in the step 150.

At step S160, a light-shielding conductive material is filled into the isolation trench.

Figure 2H:
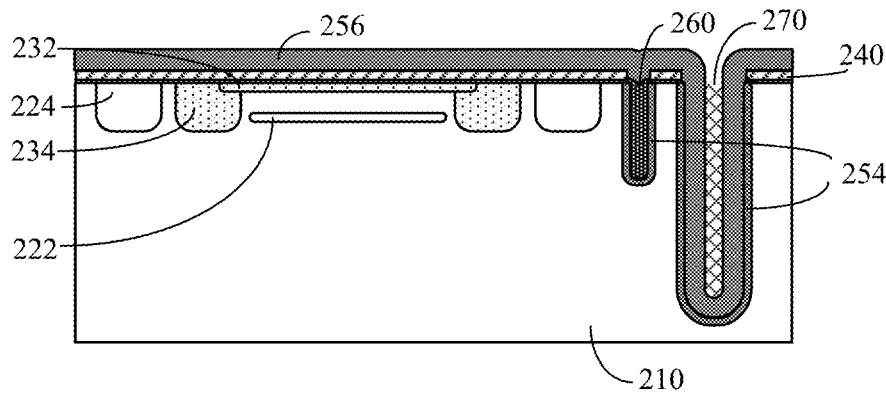

The light-shielding conductive material needs to isolate the photons, and therefore its light transmittance should be lower than those of the substrate, the epitaxial layer and the insulation layer 256. In one embodiment of the present disclosure, the light transmittance of the light-shielding conductive material is lower than those of silicon and silicon dioxide. In the embodiment shown in FIG. 2*h*, the light-shielding conductive material is a tungsten plug 270. In one embodiment of the present disclosure, a metal tungsten is deposited on the front surface of the base and then etched back to form the tungsten plug 270.

In one embodiment of the present disclosure, the insulation layer 254, the insulation layer 256 and the tungsten plug 270 jointly form the DTI structure. The tungsten plug 270 can introduce a desired potential (e.g. low potential) into the DTI, so as to better avoid the crosstalk between cells (e.g. avalanche photon diode cells).

In the above manufacturing method of the single-photon avalanche diode integrated with a quenching resistor, a polycrystalline silicon quenching resistor is formed in the quenching resistor trench 211. Since the width of the isolation trench 213 is greater than the width of the quenching resistor trench 211, when the quenching resistor trench is filled up with the polycrystalline silicon 260, the isolation trench 213 still has a space to be filled with the light-shielding conductive material subsequently. The polycrystalline silicon in the isolation trench 213 is oxidized into the insulation layer 256 in the step S150. Since the quenching resistor trench 211 is filled up with the polycrystalline silicon 260, when the polycrystalline silicon in the isolation trench 213 is oxidized, only the surface of the polycrystalline silicon 260 in the quenching resistor trench 211 is oxidized and thus the polycrystalline silicon 260 in the quenching resistor trench 211 can be retained as the polycrystalline silicon quenching resistor. In conclusion, the above manufacturing method of the single-photon avalanche diode integrated with a quenching resistor can achieve the process in which the polycrystalline silicon quenching resistor is firstly deposited and the light-shielding conductive material is then deposited, thus realizing the compatibility with CMOS process and adapting to the manufacturing processes of most semiconductor factories. On the other hand, since the quenching resistor trench 211 and the isolation trench 213 share one photo-etching plate, the manufacturing of the quenching resistor does not require separate use of one photo-etching plate, reducing the production costs.

As shown in FIG. 5, in one embodiment of the present disclosure, after the step S160, the method further includes the following step:

At step S170, a dielectric layer for covering the light-shielding conductive material is formed on the front surface of the base.

Figure 2I:
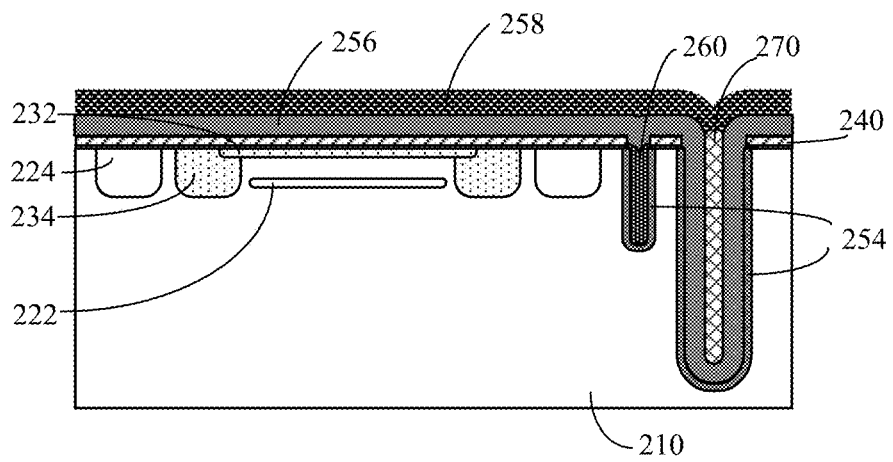

As shown in FIG. 2*i*, the dielectric layer 258 may be a silicon oxide layer, for example, a doped or un-doped silicon oxide material layer formed by thermal chemical vapor deposition (CVD) manufacturing process or high density plasma chemical vapor deposition (HDPCVD) manufacturing process, such as un-doped silicate glass (USG), phosphosilicate glass (PSG) or boro-phospho-silicate glass (BPSG).

At step S180, a cathode contact hole and a quenching resistor contact hole are formed.

Figure 2J:
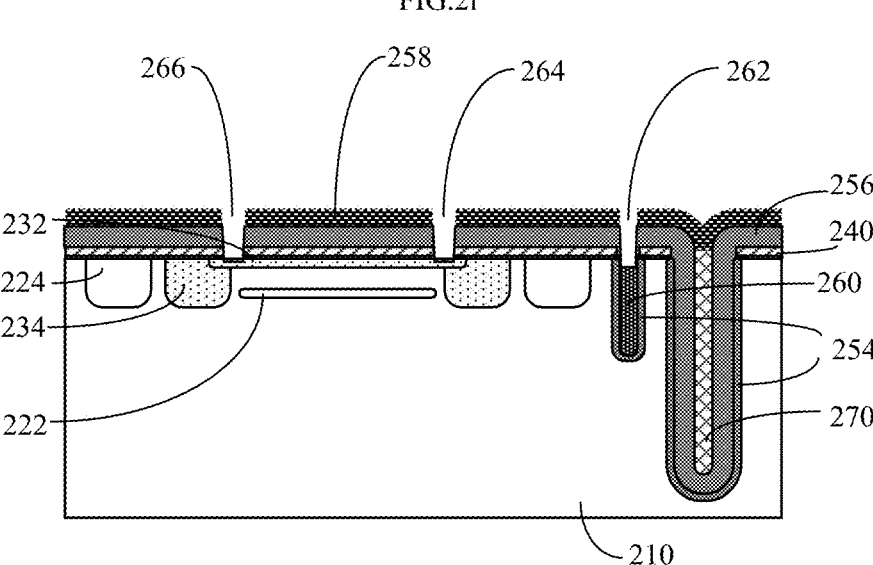
Figure 2K:
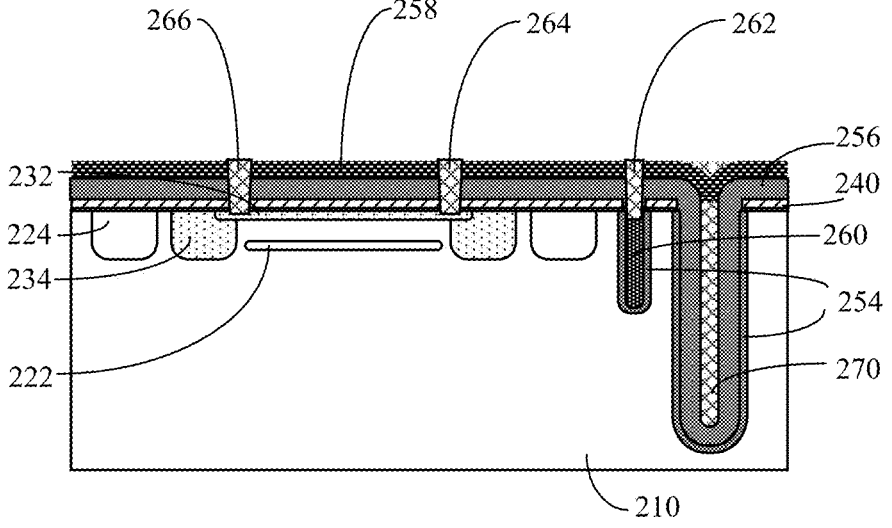

By photo-etching and etching, the cathode contact hole (including a first contact hole 264 and a second contact hole 266) and the quenching resistor contact hole 262 are formed as shown in FIG. 2j. Specifically, a photoresist may be coated on the dielectric layer 258 and then exposed by using a contact hole photo-etching plate, and then developed to form etching windows of the first contact hole 264, the second contact hole 266 and the quenching resistor contact hole 262, and then the dielectric layer 258, the insulation layer 256 and the light-transmitting silicon nitride layer 240 are corroded through these etching windows to form the first contact hole 264, the second contact hole 266 and the quenching resistor contact hole 262. The bottom of the cathode contact hole (including the first contact hole 264 and the second contact hole 266) extends to the avalanche photon diode cathode region 232 and the bottom of the quenching resistor contact hole 262 extends to the polycrystalline silicon 260. Afterwards, the first contact hole 264, the second contact hole 266 and the quenching resistor contact hole 262 are all filled with a conductive material as shown in FIG. 2k. The conductive material may be any appropriate conductive material well-known to those skilled in the arts, which includes but not limited to a metal material; where the metal material may include one or more of Ag, Au, Cu, Pd, Pt, Cr, Mo, Ti, Ta, W and Al. In one embodiment of the present disclosure, the conductive material includes a metal tungsten. The surplus conductive material on the dielectric layer 258 may be removed by chemical mechanical polish (CMP) process.

At step S190, a metal layer is formed on the dielectric layer.

Figure 2L:
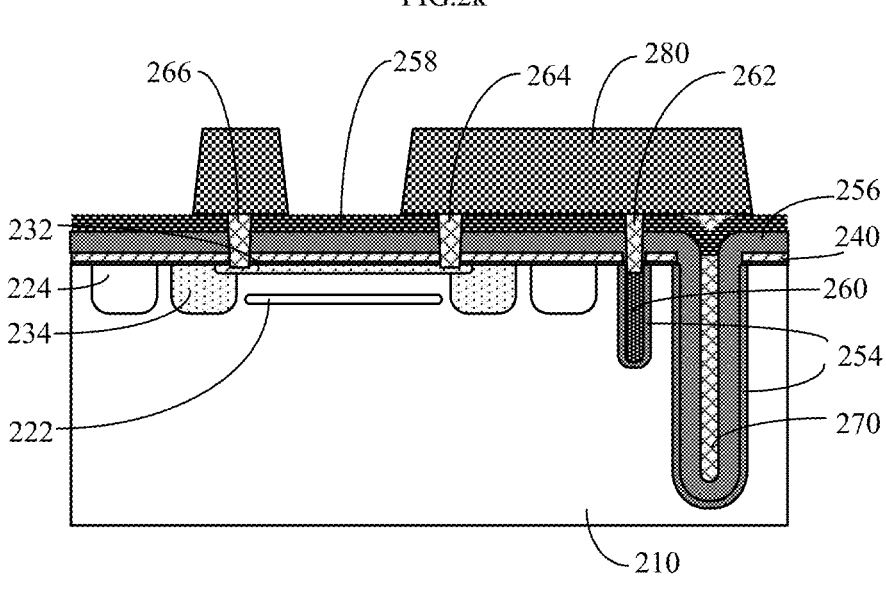

By surface metal interconnection process (i.e. a metal is deposited on the dielectric layer 258 and then photo-etched and etched) the metal layer 280 is formed. As shown in FIG. 2l, a partial structure of the metal layer 280 is electrically connected to the conductive material in the cathode contact hole (the first contact hole 264) and the conductive material in the quenching resistor contact hole 262.

Figure 2M:
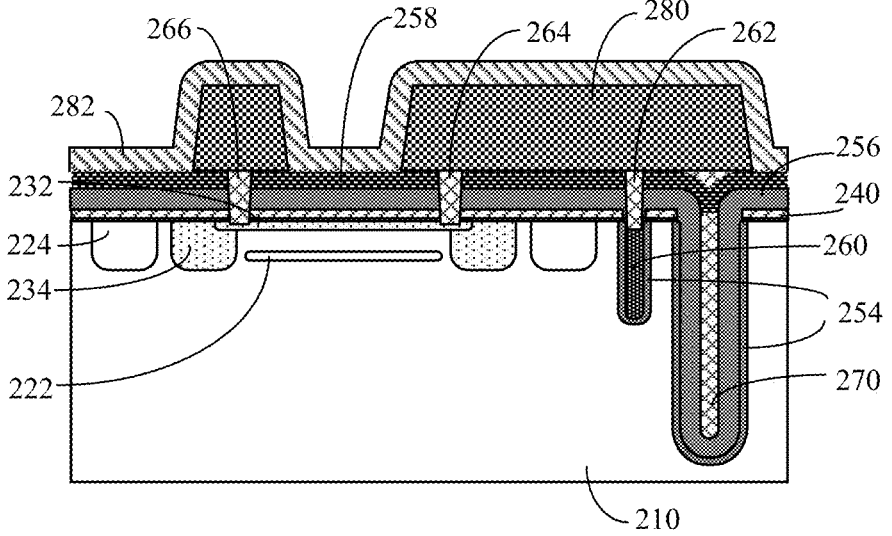

In one embodiment of the present disclosure, after the step S190, the method further includes a step of depositing a passivation layer 282 on the dielectric layer 258 and the metal layer 280, as shown in FIG. 2m. Next, hole corrosion is performed on the passivation layer, and the insulation layer 256 and the dielectric layer 258 above a partial region of the avalanche photon diode cathode region 232 are removed so as to form a light incidence window 201 on the light-transmitting silicon nitride layer 240. In this case, external light can be incident onto the avalanche photon diode cathode region 232 through the light incidence window 201. The first contact hole 264 and the second contact hole 266 are located at two sides of the light incidence window 201 separately.

In one embodiment of the present disclosure, the method further includes a step of forming a metal electrode layer on a back surface of the substrate. The metal electrode layer is taken as a metal contact of the P+ substrate.

Figure 2N:
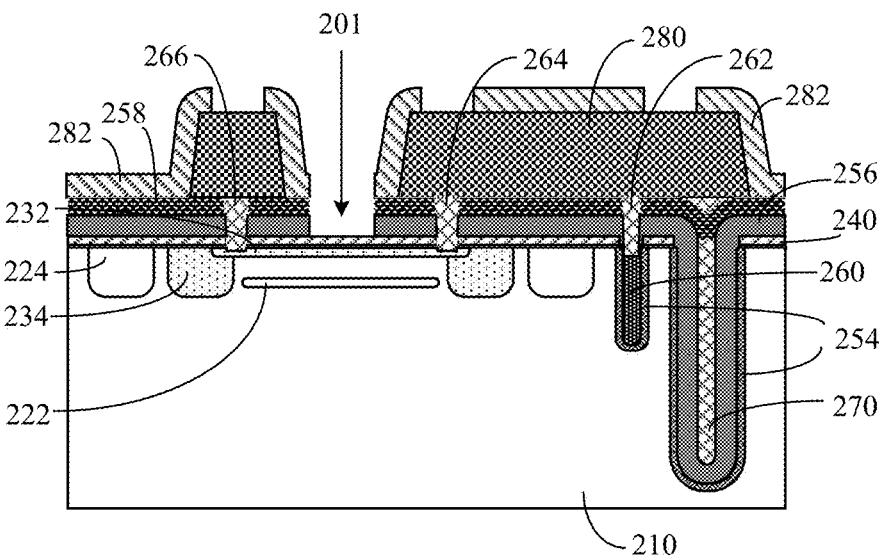

The present disclosure provides a single-photon avalanche diode integrated with a quenching resistor, which can be manufactured by the above manufacturing method of a single-photon avalanche diode integrated with a quenching resistor in any one of the above embodiments. As shown in FIG. 2n, in one embodiment of the present disclosure, the single-photon avalanche diode integrated with a quenching resistor includes a base 210 and an avalanche photon diode cell in the base 210. The base 210 further includes a quenching resistor trench and an isolation trench located outside both the avalanche photon diode cell and the quenching resistor trench, where a width of the isolation trench is greater than a width of the quenching resistor trench. An insulation layer 254 is formed on an inner surface of the quenching resistor trench and an inner surface of the isolation trench. The single-photon avalanche diode integrated with a quenching resistor further includes a polycrystalline silicon quenching resistor (i.e. polycrystalline silicon 260) inside the quenching resistor trench and a light-shielding conductive material inside the isolation trench (in the embodiment shown in FIG. 2n, the light-shielding conductive material is a tungsten plug 270). In the embodiment shown in FIG. 2n, an insulation layer 256 is formed between the insulation layer 254 and the tungsten plug 270 in the isolation trench. The insulation layer 254, the insulation layer 256 and the tungsten plug 270 in the isolation trench jointly form a deep trench isolation (DTI) structure to isolate the avalanche photon diode cell and the quenching resistor. The tungsten plug 270 can introduce a desired potential (e.g. low potential) to the DTI so as to better avoid the crosstalk between the cells (e.g. the avalanche photon diode cells).

In the above single-photon avalanche diode integrated with a quenching resistor, the polycrystalline silicon quenching resistor is formed in the quenching resistor trench, where the width of the quenching resistor trench is less than the width of the isolation trench. Therefore, the manufacturing of the quenching resistor requires no separate use of one photo-etching plate (the quenching resistor trench and the isolation trench share one photo-etching plate), thus reducing the production costs. Furthermore, the above manufacturing of the single-photon avalanche diode integrated with a quenching resistor can be compatible with the CMOS process.

In one embodiment of the present disclosure, the base 210 includes a substrate of the second conductive type and an epitaxial layer of the second conductive type on the substrate. The avalanche photon diode cell includes an avalanche photon diode cathode region 232 in the epitaxial layer, where the avalanche photon diode cathode region 232 is of the first conductive type. In one embodiment of the present disclosure, the first conductive type is N type and the second conductive type is P type. In one embodiment of the present disclosure, the single-photon avalanche diode integrated with a quenching resistor further includes a dielectric layer 258 and a metal layer 280, where the dielectric layer 258 is located on the epitaxial layer and covers the light-shielding conductive material (i.e. tungsten plug 270), and the metal layer 280 is located on the dielectric layer 258. A cathode contact hole (including a first contact hole 264 and a second contact hole 266) is formed between the metal layer 280 and the avalanche photon diode cathode region 232, and a quenching resistor contact hole 262 is formed between the metal layer 280 and the polycrystalline silicon quenching resistor (i.e. the polycrystalline silicon 260). A conductive material is filled into the cathode contact hole and the quenching resistor contact hole 262. A partial structure of the metal layer 280 is electrically connected to the conductive material in the cathode contact hole and the quenching resistor contact hole 262. A light incidence window 201 is formed above the avalanche photon diode cathode region 232. In this case, external light can be incident onto the avalanche photon diode cathode region 232 through the light incidence window 201. The first contact hole 264 and the second contact hole 266 are located at two sides of the light incidence window 201 separately.

In one embodiment of the present disclosure, the single-photon avalanche diode integrated with a quenching resistor further includes a second conductive-type well region 224 and a second conductive-type buried layer 222. The second conductive-type well region 224 is located at two sides of the avalanche photon diode cathode region 232, and the second conductive-type buried layer 222 is located in the epitaxial layer and below the avalanche photon diode cathode region 232. In one embodiment of the present disclosure, a doping concentration of the epitaxial layer is less than a doping concentration of the substrate and the second conductive-type buried layer 222.

In one embodiment of the present disclosure, the avalanche photon diode cell further includes an annular doping region 234 located in the epitaxial layer. The annular doping region is located at an inner side of the second conductive-type well region 224 at two sides of the avalanche photon diode cathode region 232, where the annular doping region 234 is of the first conductive type.

In one embodiment of the present disclosure, a light-transmitting silicon nitride layer 240 is formed between the epitaxial layer and the insulation layer 256.

In one embodiment of the present disclosure, a depth of the isolation trench is greater than a depth of the quenching resistor trench.

In one embodiment of the present disclosure, a metal electrode layer is further formed on the back surface of the substrate and taken as a metal contact of the P+ substrate.

It should be understood that although the steps in the flowchart of the present disclosure are displayed in sequence as shown by arrows, these steps are not necessarily performed in the sequence shown by the arrows. Unless otherwise clearly stated, there is strict limitation to the sequence of the steps of the flowchart of the present disclosure and the steps can be performed in another sequence. Furthermore, at least some steps in the flowchart of the present disclosure may include multiple steps or multiple stages and these steps or stages are not necessarily completed at a same time but can be performed at different times. Further, these steps or stages are not necessarily performed sequentially but performed in turns or alternately with other steps or at least a part of the steps or stages in the other steps.

In the descriptions of the present specification, the descriptions made by referring to the terms "some embodiments", or "other embodiments" or "ideal embodiments" or the like are intended to refer to that the specific features, structures, materials or features described in combination with the embodiments or examples are included in at least one embodiment or example of the present disclosure. In the specification, the illustrative descriptions for the above terms do not necessarily refer to a same embodiment or example.

The technical features of the above embodiments can be arbitrarily combined. For ease of descriptions, all possible combinations of the technical features of the above embodiments are not described. But, as long as there are no contradictions between these combinations of these technical features, such combinations shall be deemed as within the scope recorded in the specification.

The above embodiments are only used to express several implementations of the present disclosure. Despite specific and detailed descriptions of the embodiments, it should not be understood as limiting of the scope of protection of the present disclosure. It should be pointed out that persons of ordinary skills in the arts can also make various variations and improvements without departing from the idea of the present disclosure, and these variations and improvements shall all fall within the scope of protection of the present disclosure. Therefore, the scope of protection of the present disclosure shall be indicated by the appended claims.

The invention claimed is:

1. A method of manufacturing a single-photon avalanche diode integrated with a quenching resistor, comprising:
   obtaining a wafer, wherein the wafer comprises a base and an avalanche photon diode cell formed in the base;
   patterning and etching a first surface of the base to form a quenching resistor trench and an isolation trench, wherein a width of the isolation trench is greater than a width of the quenching resistor trench;
   forming an insulation layer on an inner surface of the quenching resistor trench;
   depositing polycrystalline silicon on the first surface of the base, wherein the polycrystalline silicon is filled into the quenching resistor trench and seals the quenching resistor trench while the polycrystalline silicon is filled into the isolation trench and does not seal the isolation trench;
   performing oxidation treatment on an exposed structure in the isolation trench; and
   filling a light-shielding conductive material into the isolation trench;
   wherein the isolation trench is located outside both the avalanche photon diode cell and the quenching resistor trench to isolate the avalanche photon diode cell and the quenching resistor.

2. The method of claim 1, wherein, in the step of obtaining the wafer, the avalanche photon diode cell comprises an avalanche photon diode cathode region, and the method further comprises:
   forming a dielectric layer for covering the light-shielding conductive material on the first surface of the base;
   forming a cathode contact hole and a quenching resistor contact hole; wherein a bottom of the cathode contact hole extends to the avalanche photon diode cathode region, a bottom of the quenching resistor contact hole extends to the polycrystalline silicon in the quenching resistor trench, and a first conductive material is filled into the cathode contact hole and the quenching resistor contact hole;
   forming a metal layer on the dielectric layer, wherein a partial structure of the metal layer is electrically connected to the first conductive material in the cathode contact hole and the quenching resistor contact hole; and
   by removing the dielectric layer above a partial region of the avalanche photon diode cathode region, forming a light incidence window on the first surface of the base to allow external light to be incident on the avalanche photon diode cathode region through the light incidence window.

3. The method of claim 1, wherein, the step of patterning and etching the first surface of the base to form the quenching resistor trench and the isolation trench comprises:
   performing photo-etching with a first photo-etching plate to form a quenching resistor trench etching window and an isolation trench etching window in a photoresist on the first surface of the base, wherein a width of the isolation trench etching window is greater than a width of the quenching resistor trench etching window; and
   etching the base by using the quenching resistor trench etching window and the isolation trench etching window to form the quenching resistor trench and the isolation trench;

wherein a depth of the isolation trench is greater than a depth of the quenching resistor trench.

4. The method of claim 1, wherein the step of depositing the polycrystalline silicon on the first surface of the base comprises:

wherein the polycrystalline silicon in the quenching resistor trench is used to form a polycrystalline silicon quenching resistor, doping the polycrystalline silicon to adjust a resistivity of the polycrystalline silicon quenching resistor.

5. The method of claim 1, wherein a light transmittance of the light-shielding conductive material is lower than a light transmittance of silicon and silicon dioxide.

6. The method of claim 1, wherein the step of filling the light-shielding conductive material into the isolation trench comprises:

the light-shielding conductive material being a tungsten plug used to introduce a potential to the isolation trench.

7. The method of claim 2, wherein in the step of obtaining the wafer, the base comprises a substrate of a second conductive type and an epitaxial layer on the substrate, the epitaxial layer is of the second conductive type, and the avalanche photon diode cathode region is located in the epitaxial layer and is of a first conductive type; the first conductive type and the second conductive type are opposite conductive types.

8. The method of claim 7, where in the step of obtaining the wafer, the avalanche photon diode cell further comprises:

a second conductive-type well region, located at two sides of the avalanche photon diode cathode region; and a second conductive-type buried layer, located in the epitaxial layer and below the avalanche photon diode cathode region;

wherein a doping concentration of the epitaxial layer is less than a doping concentration of the substrate and the second conductive-type buried layer.

9. The method of claim 7, wherein the step of patterning and etching the first surface of the base to form the quenching resistor trench and the isolation trench comprises:

a depth of the isolation trench being greater than or equal to a thickness of the epitaxial layer.

10. The method of claim 1, wherein before the step of patterning and etching the first surface of the base, the method further comprises a step of forming a light-transmitting silicon nitride layer on the first surface of the base and a step of forming a hard mask on the light-transmitting silicon nitride layer;

the step of patterning and etching the first surface of the base to form the quenching resistor trench and the isolation trench comprises: performing photo-etching on the hard mask and etching the hard mask, the light-transmitting silicon nitride layer and the base to form the quenching resistor trench and the isolation trench.

11. The method of claim 10, wherein a material of the hard mask comprises silicon oxide;

after the step of forming the quenching resistor trench and the isolation trench, and before the step of forming the insulation layer on the inner surface of the quenching resistor trench, the method further comprises:

performing oxidation treatment on the inner surface of the quenching resistor trench and an inner surface of the isolation trench; and removing an oxide layer on the inner surface of the quenching resistor trench and the inner surface of the isolation trench by a wet process and while removing the hard mask.

12. A single-photon avalanche diode integrated with a quenching resistor, comprising:

abase; and an avalanche photon diode cell in the base;

wherein a quenching resistor trench and an isolation trench located outside both the avalanche photon diode cell and the quenching resistor trench are formed in the base, a width of the isolation trench is greater than a width of the quenching resistor trench, and an insulation layer is formed on an inner surface of the quenching resistor trench and an inner surface of the isolation trench; the single-photon avalanche diode integrated with the quenching resistor further comprises a polycrystalline silicon quenching resistor inside the quenching resistor trench and a light-shielding conductive material inside the isolation trench; the isolation trench is used to isolate the avalanche photon diode cell and the quenching resistor.

13. The single-photon avalanche diode integrated with the quenching resistor of claim 12, wherein the base comprises a substrate of a second conductive type and an epitaxial layer of the second conductive type on the substrate, the avalanche photon diode cell comprises an avalanche photon diode cathode region in the epitaxial layer, and the avalanche photon diode cathode region is of a first conductive type; the first conductive type and the second conductive type are opposite conductive types;

the single-photon avalanche diode integrated with the quenching resistor further comprises:

a dielectric layer, located on the epitaxial layer and covering the light-shielding conductive material; and a metal layer, located on the dielectric layer;

wherein, a cathode contact hole is formed between the metal layer and the avalanche photon diode cathode region, a quenching resistor contact hole is formed between the metal layer and the polycrystalline silicon quenching resistor, a first conductive material is filled into the cathode contact hole and the quenching resistor contact hole, and a partial structure of the metal layer is electrically connected to the first conductive material in the cathode contact hole and the quenching resistor contact hole; a light incidence window is formed above the avalanche photon diode cathode region to allow external light to be incident onto the avalanche photon diode cathode region through the light incidence window.

14. The single-photon avalanche diode integrated with the quenching resistor of claim 13, wherein the avalanche photon diode cell further comprises:

a second conductive-type well region, located at two sides of the avalanche photon diode cathode region; and a second conductive-type buried layer, located in the epitaxial layer and below the avalanche photon diode cathode region;

wherein a doping concentration of the epitaxial layer is less than a doping concentration of the substrate and the second conductive-type buried layer.

15. The single-photon avalanche diode integrated with the quenching resistor of claim 12, wherein a depth of isolation trench is greater than a depth of the quenching resistor trench.

* * * * *